(12) United States Patent
Hayakawa et al.

(10) Patent No.: US 10,177,532 B2
(45) Date of Patent: Jan. 8, 2019

(54) LIGHT EMITTING ELEMENT ARRAY AND OPTICAL TRANSMISSION DEVICE

(71) Applicant: FUJI XEROX CO., LTD., Tokyo (JP)

(72) Inventors: Junichiro Hayakawa, Ebina (JP); Akemi Murakami, Kanagawa (JP); Hideo Nakayama, Kanagawa (JP); Tsutomu Otsuka, Kanagawa (JP)

(73) Assignee: FUJI XEROX CO., LTD., Minato-ku, Tokyo (JP)

( * ) Notice: Subject to any disclaimer, the term of this patent is extended or adjusted under 35 U.S.C. 154(b) by 0 days.

(21) Appl. No.: 15/783,009

(22) Filed: Oct. 13, 2017

(65) Prior Publication Data

US 2018/0138660 A1    May 17, 2018

(30) Foreign Application Priority Data

Nov. 16, 2016 (JP) ................................. 2016-223545

(51) Int. Cl.
*H01S 5/183* (2006.01)
*H01S 5/042* (2006.01)
(Continued)

(52) U.S. Cl.
CPC ...... *H01S 5/18313* (2013.01); *H01S 5/02276* (2013.01); *H01S 5/0425* (2013.01); *H01S 5/06825* (2013.01); *H01S 5/18358* (2013.01); *H01S 5/18394* (2013.01); *H01S 5/3054* (2013.01); *H01S 5/3432* (2013.01); *H01S 5/423* (2013.01); *H01S 5/026* (2013.01); *H01S 5/0282* (2013.01); *H01S 5/02248* (2013.01); *H01S 5/02296* (2013.01); *H01S 5/0683* (2013.01); *H01S 5/18311* (2013.01); *H01S 5/34313* (2013.01); *H01S 2301/176* (2013.01); *H01S 2304/04* (2013.01)

(58) Field of Classification Search
CPC ............. H01S 5/18313; H01S 5/18358; H01S 5/18394; H01S 5/3432; H01S 5/3054; H01S 5/0425; H01S 5/423
See application file for complete search history.

(56) References Cited

U.S. PATENT DOCUMENTS

2005/0169336 A1    8/2005 Ishii et al.
2013/0209027 A1*   8/2013 Yu ............................ G02B 6/12
                                                              385/14
2017/0338628 A1*  11/2017 Matsushita ......... H01S 5/02216

FOREIGN PATENT DOCUMENTS

JP         52-103984 A      8/1977
JP         56-89272 U       7/1981
(Continued)

OTHER PUBLICATIONS

Communication dated Mar. 27, 2018 from the Japanese Patent Office in counterpart application No. 2016-223545.
(Continued)

*Primary Examiner* — Dung Nguyen
(74) *Attorney, Agent, or Firm* — Sughrue Mion, PLLC

(57) ABSTRACT

A light emitting element array includes plural light emitting elements connected in parallel to each other by a wiring connected to a terminal configured to supply a current. The number of light emitting elements which have the shortest path length among path lengths on the wiring from the terminal to the respective light emitting elements along a path of the current is one.

18 Claims, 13 Drawing Sheets

(51) Int. Cl.
*H01S 5/42* (2006.01)
*H01S 5/30* (2006.01)
*H01S 5/343* (2006.01)
*H01S 5/068* (2006.01)
H01S 5/022 (2006.01)
H01S 5/026 (2006.01)
H01S 5/028 (2006.01)
H01S 5/0683 (2006.01)

(56) References Cited

FOREIGN PATENT DOCUMENTS

| | | |
|---|---|---|
| JP | 61-112662 U | 7/1986 |
| JP | 2005-252240 A | 9/2005 |
| JP | 2008-152006 A | 7/2008 |
| JP | 2009-65086 A | 3/2009 |

OTHER PUBLICATIONS

Communication dated Jun. 26, 2018 from the Japanese Patent Office in counterpart Application No. 2016-223545.

\* cited by examiner

○ LIGHT EMITTING UNIT 50

○ LIGHT EMITTING UNIT 50

○ LIGHT EMITTING UNIT 50

⊘ LIGHT EMITTING UNIT 50E

US 10,177,532 B2

LIGHT EMITTING ELEMENT ARRAY AND OPTICAL TRANSMISSION DEVICE

CROSS-REFERENCE TO RELATED APPLICATIONS

This application is based on and claims priority under 35 USC 119 from Japanese Patent Application No. 2016-223545 filed Nov. 16, 2016.

BACKGROUND

Technical Field

The present invention relates to a light emitting element array and an optical transmission device.

SUMMARY

According to an aspect of the invention, a light emitting element array includes plural light emitting elements connected in parallel to each other by a wiring connected to a terminal configured to supply a current. The number of light emitting elements which have the shortest path length among path lengths on the wiring from the terminal to the respective light emitting elements along a path of the current is one.

BRIEF DESCRIPTION OF THE DRAWINGS

Exemplary embodiments of the present invention will be described in detail based on the following figures, wherein.

DETAILED DESCRIPTION

Hereinafter, exemplary embodiments for carrying out the present invention will be described in detail with reference to the drawings.

First Exemplary Embodiment

Figure 1A:
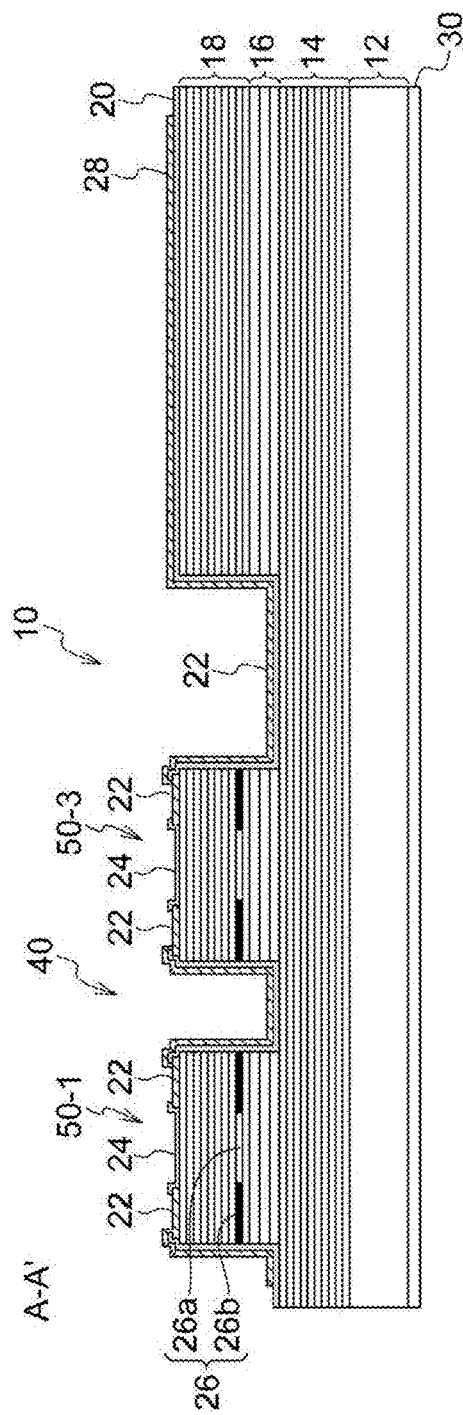
FIG. 1A is a cross-sectional view illustrating an example of the configuration of a light emitting element array according to a first exemplary embodiment.
Figure 1B:
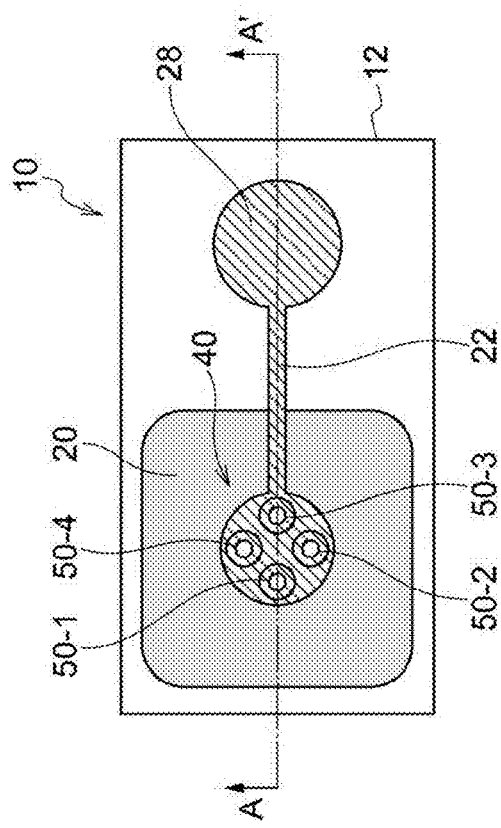
FIG. 1B is a plan view of the light emitting element array.

An example of the configuration of a light emitting element array 10 according to the present exemplary embodiment will be described with reference to FIGS. 1A and 1B. An example in which a vertical cavity surface emitting laser (VCSEL) array is applied to a light emitting element array according to the present exemplary embodiment will be described below. FIG. 1A is a cross-sectional view of the light emitting element array 10 according to the present exemplary embodiment. FIG. 1B is a plan view of the light emitting element array 10. The cross-sectional view illustrated in FIG. 1A is a cross-sectional view taken along the line A-A' in the plan view illustrated in FIG. 1B. As one example, the light emitting element array 10 is used in an optical transmitter of an optical transmission device. Light emitted from the light emitting element array 10 is coupled to an optical transmission path of an optical fiber or the like. In the present exemplary embodiment, plural VCSELs are mainly used in order to secure the redundancy of light emitted from the optical transmitter. That is, each of the light emitting elements constituting the light emitting element array according to the exemplary embodiment has a rating capable of outputting the amount of light required to perform communication as a single light emitting element, and the light emitting element array is configured with the plural light emitting elements connected in parallel to each other so that even if one of the light emitting elements is damaged, normal communication is still maintained. With this configuration, redundancy is secured. It should be noted that it is not always necessary for each light emitting element to be capable of emitting the amount of light required to perform communication as a single light emitting element.

As illustrated in FIG. 1A, the light emitting element array 10 is formed into a stacked structure. The stacked structure includes an n-side electrode wiring 30, an n-type lower distributed Bragg reflector (DBR) 14 formed on an n-type gallium arsenide (GaAs) substrate 12, an active layer area 16, an oxide confinement layer 26, a p-type upper DBR 18, an interlayer insulating film 20, and a p-side electrode wiring 22.

As illustrated in FIG. 1B, the light emitting element array 10 includes a light emitting area 40 and a p-side electrode pad 28.

The light emitting area 40 is an area configured as a VCSEL array including multiple light emitting units. In the present exemplary embodiment, for example, four light emitting units 50-1, 50-2, 50-3, and 50-4 (which may be collectively referred to as a "light emitting unit 50" below) formed in mesa shapes are provided. The area of each light emitting unit excluding an emission aperture is covered with the p-side electrode wiring 22, so that the respective light emitting units are electrically connected in parallel to each other. The p-side electrode pad 28 is a pad to which a positive electrode of a power supply is connected when connecting the power supply which supplies current to the light emitting area 40 via the p-side electrode wiring 22. In addition, a negative electrode of the power supply is connected to the n-side electrode wiring 30 which is formed on the back surface of the substrate 12. With the configuration described above, when power is supplied to the light emitting element array 10, light is emitted substantially simultaneously from respective light emitting units.

Assuming that the oscillation wavelength of the light emitting element array 10 is λ and the refractive index of a medium (semiconductor layer) is n, the n-type lower DBR 14 formed on the substrate 12 is a multilayered-film reflector formed by alternately and repeatedly stacking two semiconductor layers which have a film thickness of 0.25 λ/n and have different refractive indices.

The active layer area 16 formed on the lower DBR 14 is an area that generates light to be emitted from a light emitting unit 50. The active layer area 16 includes a lower spacer 114, a quantum well active layer 116, and an upper spacer 118 which are formed in this order on the lower DBR 14 (see FIGS. 5A to 5F).

The quantum well active layer 116 according to the present exemplary embodiment may be configured with, for example, barrier layers of four GaAs layers and quantum well layers of three InGaAs layers each provided between the adjacent GaAs layers. In addition, the lower spacer 114 and the upper spacer 118 are respectively disposed between the quantum well active layer 116 and the lower DBR 14 and between the quantum well active layer 116 and the upper DBR 18. With this configuration, the lower spacer 114 and the upper spacer 118 have a function of adjusting the length of a resonator and serve as clad layers for confining carriers.

The p-type oxide confinement layer 26, provided on the active layer area 16, is a current confinement layer. The p-type oxide confinement layer 26 includes a non-oxidized area 26a and an oxidized area 26b. The current flowing from the p-side electrode pad 28 toward the n-side electrode wiring 30 is narrowed (confined) by the non-oxidized area 26a.

The upper DBR 18, formed on the oxide confinement layer 26, is a multilayered-film reflector formed by alternately and repeatedly stacking two semiconductor layers which have a film thickness of 0.25 λ/n and have different refractive indices.

On the upper DBR 18, an emission surface protection layer 24 is provided to protect a light emission surface. The emission surface protection layer 24 is formed, for example, by depositing a silicon nitride film.

As illustrated in FIGS. 1A and 1B, the interlayer insulating film 20 as an inorganic insulating film is deposited around a semiconductor layer including the mesa of the light emitting unit 50. The interlayer insulating film 20 is disposed below the p-side electrode wiring 22 and the p-side electrode pad 28. The interlayer insulating film 20 according to the present exemplary embodiment is formed of, for example, a silicon nitride film (SiN film). It should be noted that the material of the interlayer insulating film 20 is not limited to the silicon nitride film. The material of the interlayer insulating film 20 may be, for example, a silicon oxide film ($SiO_2$ film) or a silicon oxynitride film (SiON film).

As illustrated in FIG. 1A, the p-side electrode wiring 22 is connected to the upper DBR 18 through an opening in the interlayer insulating film 20. A contact layer 124 (see FIGS. 5A to 5F) for connection with the p-side electrode wiring 22 is provided in the uppermost layer of the upper DBR 18. One end side of the p-side electrode wiring 22 is connected to the upper DBR 18 via the contact layer 124 and forms an ohmic contact with the upper DBR 18.

Meanwhile, a VCSEL, which constitutes the light emitting unit 50 of the light emitting element array 10, is suitably used, for example, as a light source for optical communication because the VCSEL provides a laser output in a direction perpendicular to the substrate and further facilitates array formation by two-dimensional integration.

The VCSEL includes a pair of distributed Bragg reflectors (the lower DBR 14 and the upper DBR 18) provided on a semiconductor substrate (the substrate 12) and an active layer area (the active layer area 16) formed between the pair of distributed Bragg reflectors. The VCSEL is configured such that current is injected into the active layer area by electrodes (the p-side electrode wiring 22 and the n-side electrode wiring 30) provided on the opposite sides of the distributed Bragg reflectors, laser oscillation is generated perpendicularly to the substrate surface, and oscillated light is emitted from the top of the element (the surface side of the emission surface protection layer 24).

In addition, an oxide confinement layer (the oxide confinement layer 26) which is formed by oxidizing a semiconductor layer containing Al in the composition thereof is provided in terms of, for example, low threshold current and controllability of a transverse mode. In order to oxidize the semiconductor layer containing Al, the element is etched into a mesa shape and is subjected to an oxidation treatment. Thereafter, the mesa-shaped side surface exposed by the etching processing and the etched semiconductor surface are generally covered with an insulating material such as a silicon nitride film or a silicon oxide film.

Here, not only the light emitting element array 10 according to the present exemplary embodiment but also semiconductor elements might be damaged by electrostatic discharge (ESD). That is, discharge current flows into the semiconductor element due to a surge applied from the outside or the like, which might damage the semiconductor element by local heat generation and electric field concentration. A surge caused by ESD generally reaches an internal circuit of a semiconductor element through an input/output terminal (input/output pad) or a power supply terminal (power supply pad) of the semiconductor element, which might damage the internal circuit.

Therefore, how much resistance a manufactured semiconductor element has against a surge due to ESD may be known in advance. As a test for this, an ESD withstand voltage test is known. The ESD withstand voltage test applies a high voltage pulse which simulates a surge due to ESD to a semiconductor element via a terminal (pad) to know the damaged state of the semiconductor element or the like. In the present exemplary embodiment, "surge" means at least one of surge current or surge voltage. In addition, "damage (damaged)" includes a state where a light emitting element does not completely emit light and a state where the performance of a light emitting element is deteriorated due to a surge, such as a reduction in the amount of light.

The inventors carried out the ESD withstand voltage test for light emitting element arrays and inspected the state of individual light emitting units in the light emitting element arrays. The inspection results reveals that the degree of damage due to ESD depends on the path length on a wiring from a terminal to each of the plural light emitting units along the path of current.

Figure 2:
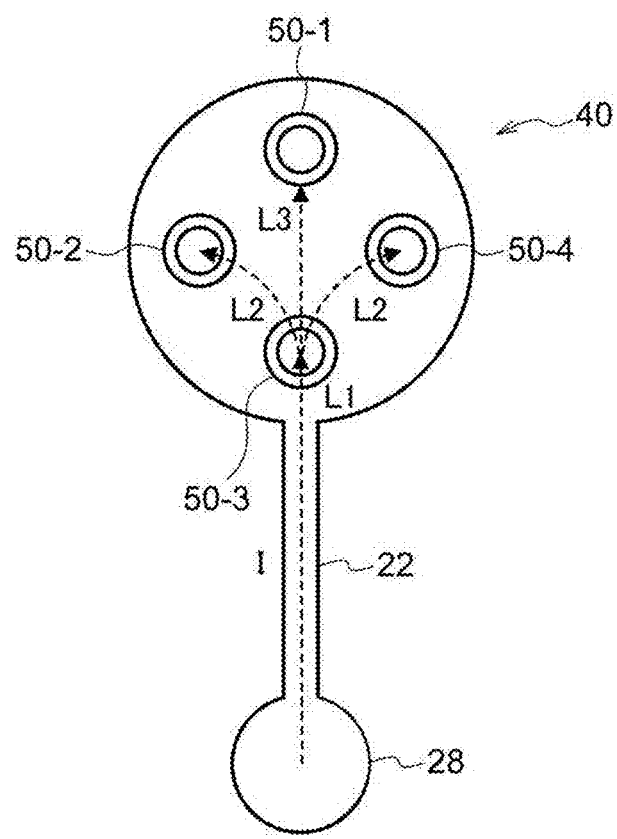
FIG. 2 is an explanatory view of a path length from a pad of a light emitting unit in a light emitting area according to the first exemplary embodiment.

A path length from a terminal to a light emitting unit 50 will be described with reference to FIG. 2. FIG. 2 is a view illustrating the light emitting area including light emitting units 50-1, 50-2, 50-3 and 50-4, the p-side electrode pad 28, and the p-side electrode wiring 22, which are extracted from the light emitting element array 10 illustrated in FIGS. 1A and 1B. In the present exemplary embodiment, the light emitting units 50-1, 50-2, 50-3 and 50-4 are electrically connected in parallel. In FIG. 2, a current I flows from the p-side electrode pad 28 to the light emitting area 40. Apart of the current I is supplied to each of the light emitting units 50-1, 50-2, 50-3 and 50-4. In this case, the path of the current from the p-side electrode pad 28 to the light emitting unit 50-3 through the p-side electrode wiring 22 is defined as a path length L1. From this definition, the path length for the light emitting unit 50-2 is defined as L2, the path length for the light emitting unit 50-4 is defined as L2, and the path length for the light emitting unit 50-1 is defined as L3. In the example illustrated in FIG. 2, it is assumed that the light emitting units 50-2 and 50-4 are equidistant from the p-side electrode pad 28. In the example illustrated in FIG. 2, a magnitude relationship between the path lengths L1, L2 and L3 is set to be L1<L2<L3. That is, the path length L1 of the light emitting unit 50-3 is the shortest path length, and the path length L3 of the light emitting unit 50-1 is the longest path length. As illustrated in FIG. 2, in the light emitting element array according to the present exemplary embodiment, the number of light emitting units 50 having the shortest path length is just one.

The ESD withstand voltage test for light emitting element arrays carried out by the inventors reveals that even if plural light emitting units 50 are disposed to have small spacing therebetween, such as about 50 μm, stress is not equally applied to all the light emitting units 50, and a light emitting unit 50 having a shorter path length, that is, the light emitting unit 50 which is disposed more upstream on the path of the driving current is more easily damaged. Thus, when plural light emitting units 50 have the shortest path length among the path lengths measured from the pad to the respective light emitting units 50, a possibility that the plural light emitting units 50 are damaged simultaneously is high. If the plural light emitting units 50 are damaged simultaneously and the amount of emission light is reduced, the driving current for the remaining normal light emitting unit 50 is increased in order to compensate for the amount of light from damaged plural light emitting units, which might reduce the service life of the remaining normal light emitting unit 50 at an accelerated pace. In particular, the following limitation may be imposed on an optical transmission device which will be described later. The standard core diameter of a multi-mode fiber is as small as 100 μm or less (50 μm or 62.5 μm). Thus, when a multi-mode fiber is used as, for example, an optical transmission path for communication, the number of light emitting units 50 may often be limited to, for example, 5 or less (about 2 to 5) in order to cause light from the plural light emitting units 50 connected in parallel to enter the core of the multi-mode fiber. Therefore, in such an optical transmission device, the service life of the optical transmission device is greatly affected when the plural light emitting units 50 do not emit light simultaneously.

Thus, in the light emitting element array 10 according to the present exemplary embodiment, the number of light emitting units 50 having the shortest path length among the path lengths measured from the pad to the respective light emitting units 50 is just one. This configuration decreases the number of light emitting units 50 that are damaged simultaneously by a surge, compared to a case where plural light emitting units 50 having the shortest path length are provided. In particular, in the case of using a multi-mode fiber as the optical transmission path, it is prevented that simultaneously damaging the plural light emitting units 50 reduces the service life of the optical transmission device.

In addition, with the light emitting element array 10 according to the present exemplary embodiment, the service life of the light emitting element array 10 is notified at an earlier stage. In general, a light emitting element has an inherent service life. In a device that adopts a light emitting element array, it is necessary to warn a user using the device that the light emitting element array has reached the end of the service life thereof. In this case, even if the warning is issued just before the plural light emitting units 50 reach the end of the service life thereof and the light emitting element array becomes unusable, the user might miss the replacement of the light emitting element array. Therefore, it is very convenient if the notification that the light emitting element array is getting closer to the end of the service life thereof is issued before the light emitting element array becomes unusable.

In this regard, if the notice is issued at the time when the light emitting unit 50 having the shortest path length is damaged in the light emitting element array 10 according to the present exemplary embodiment, the notice urges the user to replace the light emitting element array 10 earlier than the service life limit of the light emitting element array 10 at which the plural light emitting units 50 have reached the end of their service life. Therefore, the user has enough time to replace.

Next, the results of the ESD damage test performed for a light emitting element array according to a comparative example will be described with reference to FIGS. 3A to 3E and FIGS. 4A to 4E. The light emitting element array according to the comparative example used in this test includes a light emitting area 90 according to the comparative example illustrated in FIG. 3E. That is, the light emitting area 90 includes light emitting units 50-1, 50-2, 50-3 and 50-4 having the same structure. A p-side electrode wiring 22 extends from the light emitting area 90 to a lower part of the sheet of the figure and is connected to a p-side electrode pad 28 (not illustrated). The path length of the light emitting unit 50-1 is equal to the path length of the light emitting unit 50-2. The path length of the light emitting unit 50-3 is equal to the path length of the light emitting unit 50-4. The path lengths of the light emitting units 50-1 and 50-2 are shorter than those of the light emitting units 50-3 and 50-4. In other words, two (50-1 and 50-2) light emitting units 50 having the shortest path length are provided in the light emitting area 90. In addition, the distance between the centers of the respective light emitting units is set to about 50 μm. The distance from the center position of the p-side electrode pad 28 (not illustrated) to the position of center of gravity of the plural light emitting units 50-1 to 50-4 (the center position of the light emitting area 90) is set to about 160 μm.

Figure 3A:
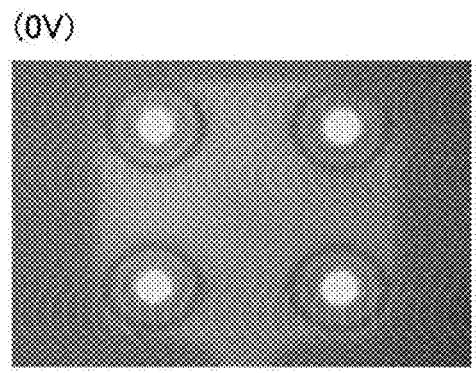
FIGS. 3A to 3D are images of light emitting units illustrating the results of ESD withstand voltage test of a light emitting element array according to a comparative example.
Figure 3B:
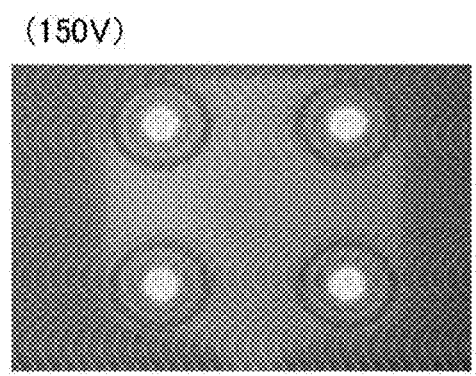
Figure 3C:
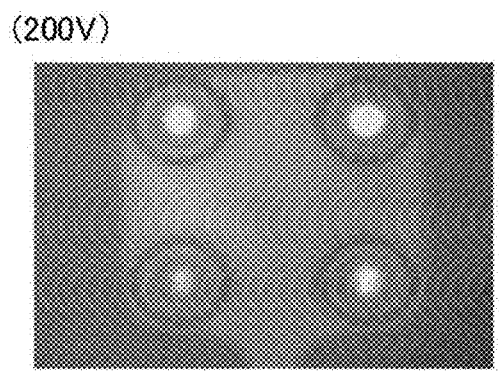
Figure 3D:
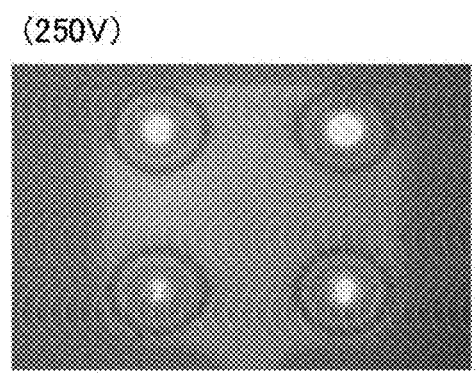
Figure 3E:
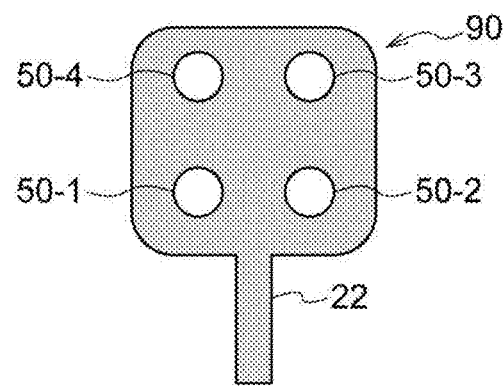
FIG. 3E is a plan view illustrating the arrangement of the respective light emitting units of the light emitting element array according to the comparative example.

FIGS. 3A to 3D illustrate the light emitting state of the light emitting area 90 after the voltage of the ESD test is applied to the light emitting element array according to the comparative example via the p-side electrode pad 28. The arrangement of the light emitting units 50 in FIGS. 3A to 3D is the same as that in FIG. 3E. FIG. 3A illustrates the light emitting state when the applied voltage is 0V (that is, the initial state). FIG. 3B illustrates the light emitting state when the applied voltage is 150V. FIG. 3C illustrates the light emitting state when the applied voltage is 200V. FIG. 3D illustrates the light emitting state when the applied voltage is 250V.

As illustrated in FIG. 3B, there is almost no change in the light emitting state of the light emitting unit 50 when the applied voltage is 150V. As illustrated in FIGS. 3C and 3D, when the applied voltages are 200V and 250V, the amount of light of the light emitting units 50-1 and 50-2 is reduced. From these results, it can be seen that a light emitting unit 50 having a shorter path length is more easily damaged and that if plural light emitting units 50 have the shortest path length, they are easily damaged simultaneously.

Figure 4A:
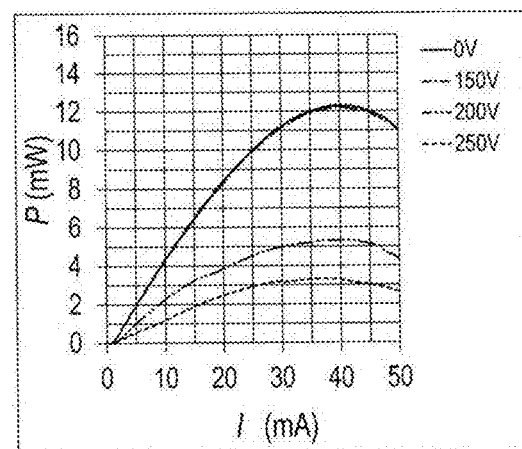
FIG. 4A is a graph illustrating optical output characteristics, which are a part of the results of ESD withstand voltage test, of the light emitting element arrays according to comparative examples.
Figure 4B:
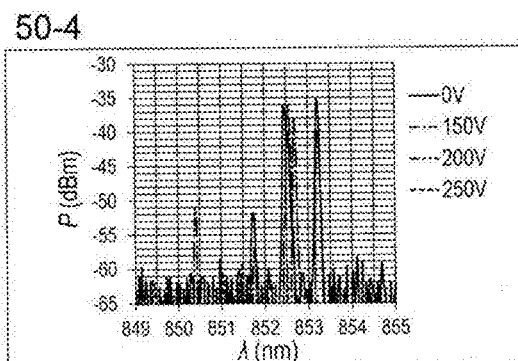
FIGS. 4B to 4E are graphs illustrating spectrum characteristics, which are a part of the results of ESD withstand voltage test, of the light emitting element arrays according to comparative examples.
Figure 4C:
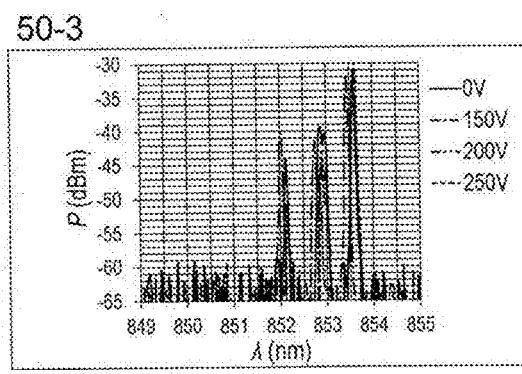
Figure 4D:
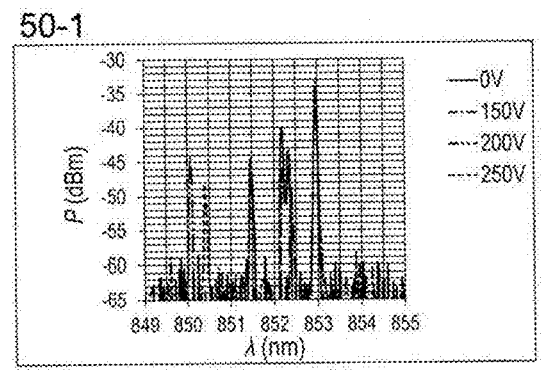
Figure 4E:
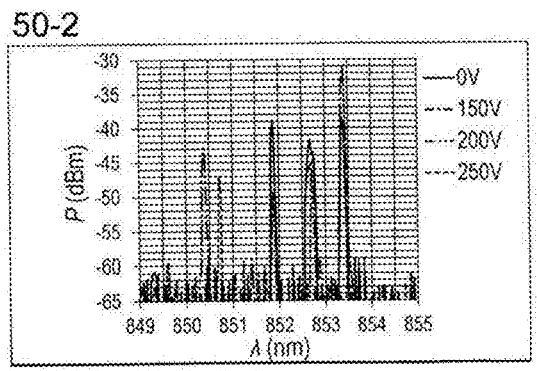

FIGS. 4A to 4E illustrate the results obtained by inspecting the optical output characteristics of light emitting element arrays according to four comparative examples after the voltages are applied. FIG. 4A illustrates the inspection result of optical outputs P. FIG. 4B illustrates the inspection result of the spectrum of output light of the light emitting unit 50-4. FIG. 4C illustrates the inspection result of the spectrum of output light of the light emitting unit 50-3. FIG. 4D illustrates the inspection result of the spectrum of output light of the light emitting unit 50-1. FIG. 4E illustrates the inspection result of the spectrum of output light of the light emitting unit 50-2.

It can be seen from FIG. 4A that although there is almost no change from the initial state when the applied voltage is 150V (in FIG. 4A, curves for the applied voltages of 0V and 150V overlap each other), the characteristics of the optical output P with respect to the current I deteriorate when the applied voltage is increased to 200V and 250V.

It can be seen from FIGS. 4B and 4C that the light emitting units 50-4 and 50-3 have substantially no change in spectrum even if the applied voltage is increased. On the other hand, it can be seen from FIGS. 4D and 4E that the wavelengths of the light from the light emitting units 50-1 and 50-2 are shifted to short wavelengths and then disappear as the applied voltage increases.

That is, it can be seen from the test results of FIGS. 4B to 4E that when a failure occurs in a part of the light emitting units 50 of the light emitting area 90, the uniformity among the spectral characteristics of the plural light emitting units 50 is lost. When such a phenomenon occurs, for example, there is a risk that a deterioration in transmission quality may occur in an optical transmission device which will be described later. From this point, the number of light emitting elements that are damaged simultaneously by a surge may be reduced.

Next, a method of manufacturing the light emitting element array 10 according to the present exemplary embodiment will be described with reference to FIGS. 5A to 5F. The light emitting element array 10 includes the four light emitting units 50 as illustrated in FIG. 1B. The light emitting units 50 are manufactured by the same manufacturing process. Thus, in the following description, one of the light emitting units 50 will be illustrated and described. It should be noted that in FIGS. 5A to 5F, components having the same names but different reference numerals from those in FIGS. 1A and 1B have the same functions.

Figure 5A:
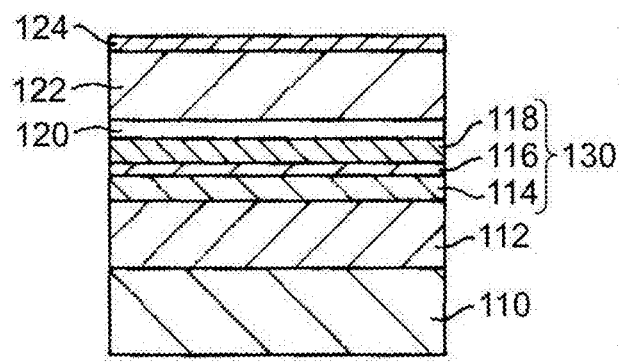
FIGS. 5A to 5F are cross-sectional views illustrating an example of a method of manufacturing the light emitting element array according to the first exemplary embodiment.

First, as illustrated in FIG. 5A, an n-type lower DBR 112, an active layer area 130, a p-type AlAs layer 120, a p-type upper DBR 122, and the contact layer 124 are sequentially stacked on a substrate 110 formed of n-type GaAs by the metal organic chemical vapor deposition (MOCVD) method. The n-type lower DBR 112 is formed by stacking 30 pairs of AlAs and GaAs so that each film thickness becomes one quarter of the intra-medium wavelength $\lambda'$ ($=\lambda/n$). The n-type lower DBR 112 has a carrier concentration of $1\times10^{18}$ cm$^{-3}$. The active layer area 130 includes the lower spacer 114 formed of undoped $Al_{0.22}Ga_{0.78}As$, the undoped quantum well active Layer 116 (configured with three InGaAs quantum well layers having a film thickness of 80 nm and four GaAs barrier layers having a film thickness of 150 nm), and the upper spacer 118 formed of undoped $Al_{0.22}Ga_{0.78}As$. A film thickness of the active layer area 130 is the intra-medium wavelength $\lambda'$. The p-type AlAs layer 120 has a carrier concentration of $1\times10^{18}$ cm$^{-3}$ and a film thickness of one quarter of the intra-medium wavelength $\lambda'$. The p-type upper DBR 122 is formed by stacking 22 pairs of $Al_{0.9}Ga_{0.1}As$ and GaAs so that each film thickness becomes one quarter of the intra-medium wavelength $\lambda'$. The p-type upper DBR 122 has a carrier concentration of $1\times10^{18}$ cm$^{-3}$. A total film thickness of the p-type upper DBR 122 is about 2 µm. The contact layer 124, is formed of p-type GaAs, has a carrier concentration of $1\times10^{19}$ cm$^{-3}$ and a film thickness of the intra-medium wavelength $\lambda'$.

The film formation is successively performed by using trimethylgallium, trimethylaluminum, trimethylindium, and arsine as a raw gas, cyclopentadinium magnesium as a p-type dopant material, and silane as an n-type dopant material, setting the substrate temperature to 750° C. during the film growth, and sequentially changing the raw gases without breaking a vacuum.

Figure 5B:
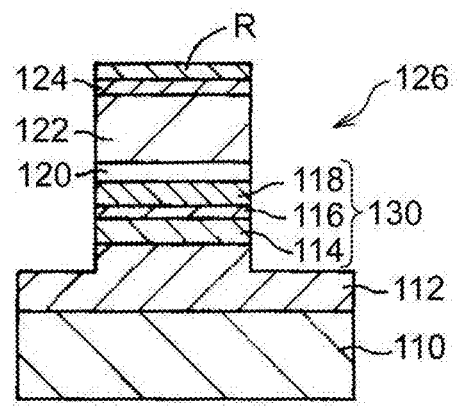

Next, as illustrated in FIG. 5B, the stacked films are etched to an intermediate portion of the lower DBR 112 to form a mesa 126, and the side surface of the AlAs layer 120 is exposed. In order to process the mesa shape, a resist mask R is formed on a crystal growth layer by photolithography, and reactive ion etching using carbon tetrachloride as an etching gas is performed.

Figure 5C:
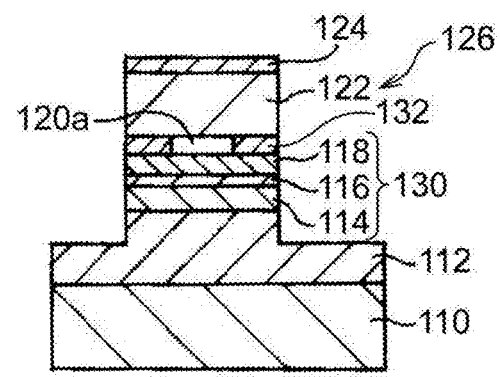

Thereafter, the resist mask R is removed. As illustrated in FIG. 5C, only the AlAs layer 120 is oxidized from the lateral side by water vapor in a furnace at about 400° C. so that the resistance thereof is increased. As a result, the AlAs layer 120 is formed into an oxidized area 132 and a non-oxidized area 120a. The diameter of the non-oxidized area 120a is, for example, about 3 µm. This non-oxidized area 120a serves as a current injection area.

Figure 5D:
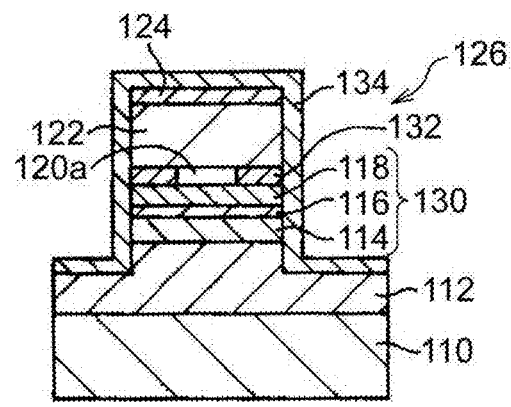
Figure 5E:
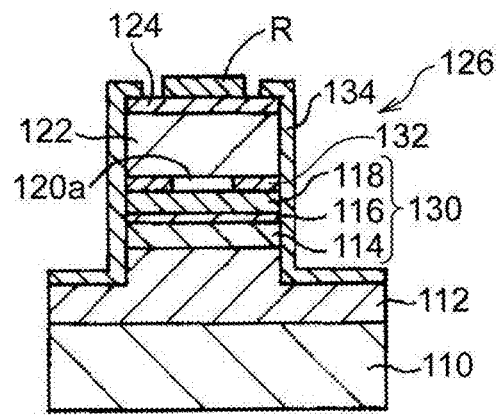
Figure 5F:
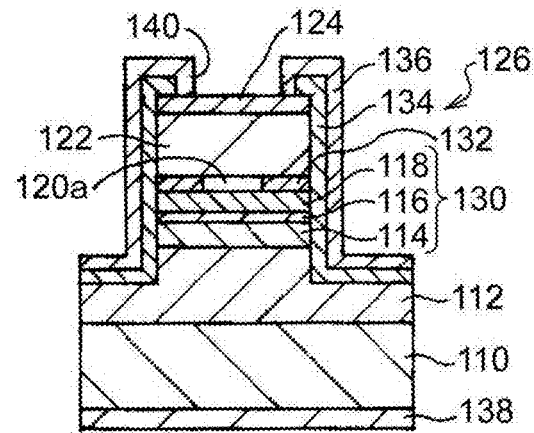

Thereafter, as illustrated in FIGS. 5D and 5E, an interlayer insulating film 134 formed of SiN is vapor-deposited thereon, except for the upper surface of the mesa 126. A p-side electrode wiring 136 formed of Ti/Au is formed thereon, except for an emission aperture 140, using the resist mask R. Au/Ge is vapor-deposited as an n-side electrode wiring 138 on the back surface of the substrate 110. In this way, the light emitting element array 10 illustrated in FIG. 5F is completed. The mode in which the current confinement structure is formed by oxidation is described by way of an example in the present exemplary embodiment. It should be noted that the exemplary embodiments are not limited thereto. For example, a current confinement structure may be formed by ion implantation.

[First Modification of First Exemplary Embodiment]

The light emitting area of the light emitting element array according to a first modification of the present exemplary embodiment and that of a comparative example will be described with reference to FIGS. 6A to 6I. FIGS. 6A, 6C, 6E, 6F, 6H, and 6I are plan views each illustrating an example of the arrangement of the light emitting units 50 in the light emitting area 40 according to a first modification of the first exemplary embodiment. FIGS. 6B, 6D, and 6G are plan views each illustrating the arrangement of light emitting units 50 in a light emitting area 40C according to a comparative example. In FIGS. 6A to 6I, a portion of the p-side electrode wiring 22 is illustrated as well. The p-side electrode pad 28 is disposed at a lower side of the p-side electrode wiring 22 in an extending direction of the p-side electrode wiring 22. In the present exemplary embodiment, the arrangement of the light emitting units 50 in the light emitting area 40 may be modified in various manners.

Figure 6A:
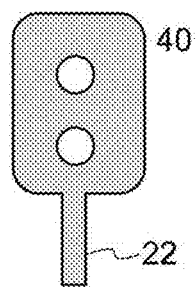
FIGS. 6A, 6C, 6E, 6F, 6H, and 6I are plan views each illustrating an example of the arrangement of light emitting units in the light emitting area according to a first modification of the first exemplary embodiment.
Figure 6B:
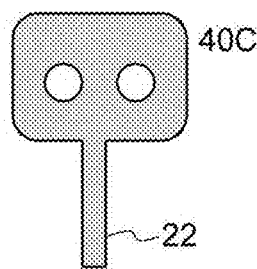
FIGS. 6B, 6D, and 6G are plan views each illustrating the arrangement of light emitting units in a light emitting area according to comparative examples.

FIG. 6A illustrates an example in which two light emitting units 50 are disposed in the light emitting area 40 of the first modification of the first exemplary embodiment. Meanwhile, FIG. 6B shows that two light emitting units 50 are disposed in the light emitting area 40C of the comparative example. If two light emitting units 50 are provided, the light emitting units 50 are disposed as illustrated in FIG. 6A so that the number of light emitting units 50 having the shortest path length is just one. Unlike the light emitting area 40 according to the present exemplary embodiment illustrated in FIG. 6A, the two light emitting units 50 have the same path length in the light emitting area 40C of the comparative example illustrated in FIG. 6B. Thus, there is a high possibility that the light emitting units 50 are damaged simultaneously.

Figure 6C:
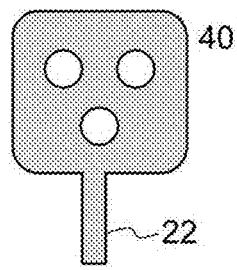
Figure 6D:
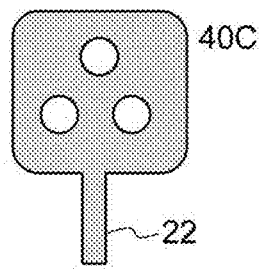

FIG. 6C illustrates an example in which three light emitting units 50 are disposed in the light emitting area 40 of the first modification of the first exemplary embodiment. Meanwhile, FIG. 6D shows that three light emitting units 50 are disposed in the light emitting area 40C of the comparative example. If three light emitting units 50 are provided, the light emitting units 50 are disposed as illustrated in FIG. 6C as an example so that the number of light emitting units 50 having the shortest path length is just one. Unlike the light emitting area 40 according to the present exemplary embodiment illustrated in FIG. 6C, two light emitting units 50 have the shortest path length in the light emitting area 40C of the comparative example illustrated in FIG. 6D. Thus, there is a high possibility that the light emitting units 50 are damaged simultaneously.

Figure 6E:
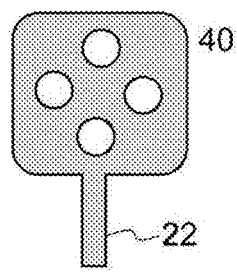
Figure 6F:
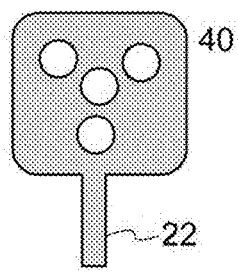
Figure 6G:
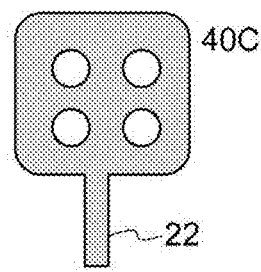

FIGS. 6E and 6F illustrate examples in which four light emitting units 50 are disposed in the light emitting area 40. Meanwhile, FIG. 6G shows that the four light emitting units are disposed in the light emitting area 40C of the comparative example. If four light emitting units 50 are provided, the light emitting units 50 are disposed as illustrated in FIGS. 6E and 6F as examples so that the number of light emitting units 50 having the shortest path length is just one. Unlike the light emitting area 40 according to the present exemplary embodiment illustrated in FIGS. 6E and 6F, two light emitting units 50 have the shortest path length in the light emitting area 40C of the comparative example illustrated in FIG. 6G. Thus, there is a high possibility that the light emitting units 50 are damaged simultaneously.

Figure 6H:
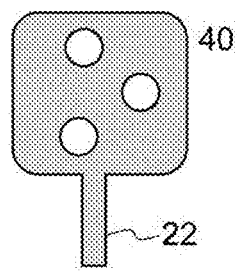
Figure 6I:
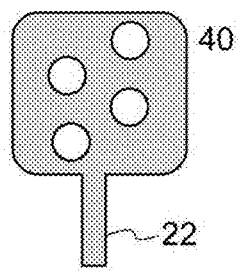

FIGS. 6H and 6I illustrate examples in which three or four light emitting units 50 are disposed in the light emitting area 40. As illustrated in FIGS. 6H and 6I, the light emitting units 50 may be arranged in a staggered pattern so that the number of light emitting units 50 having the shortest path length is just one. In other words, in the light emitting areas 40 illustrated in FIGS. 6H and 6I, all of the three or four light emitting units 50 have different path lengths. Therefore, different ESD stresses are applied to the respective light emitting units 50 when ESD is applied from the p-side electrode pad 28, and a possibility that the plural light emitting units 50 do not emit light simultaneously is reduced.

[Second Modification of First Exemplary Embodiment]

The light emitting area of the light emitting element array according to a second modification of the present exemplary embodiment will be described with reference to FIGS. 7A and 7B. In the second modification of the present exemplary embodiment, a slit is formed in the light emitting area 40 so that the number of light emitting unit 50 having the shortest path length is just one.

Figure 7A:
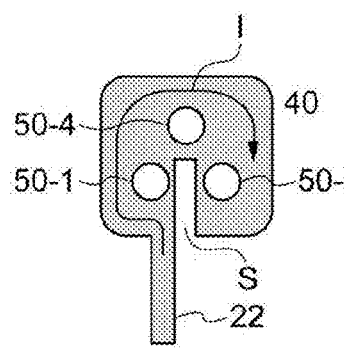
FIGS. 7A and 7B are plan views each illustrating an example of the arrangement of light emitting units in the light emitting area according to a second modification of the first exemplary embodiment.

FIG. 7A illustrates the light emitting area 40 according to the second modification of the present exemplary embodiment in a case where the number of light emitting units 50 is three. When focusing on only the arrangement of the light emitting units 50, the light emitting area 40 illustrated in FIG. 7A is the same as the light emitting area 40C of the comparative example in which the two light emitting units 50 have the shortest path length as illustrated in FIG. 6D. However, in the light emitting area 40 illustrated in FIG. 7A, a slit S is formed in the p-side electrode wiring 22 provided in the light emitting area 40. With this configuration, the path of the current is directed (regulated) along the slit S, so that the path of the current I becomes a path indicated by an arrow in FIG. 7A. Therefore, the light emitting units 50-1, 50-2 and 50-3 are aligned along the direction of the current I. The light emitting unit 50 having the shortest path length is only the light emitting unit 50-1. It should be noted that the slit S is an example of a regulation area configured to regulate the path of the current flowing to the light emitting unit 50. The slit S may have any other shape so long as it regulates the path of the current.

Figure 7B:
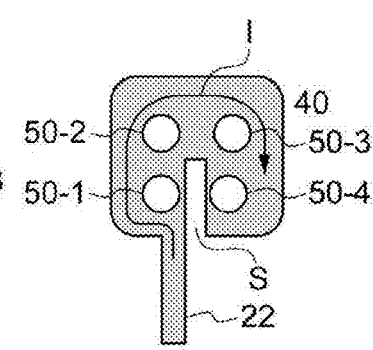

Meanwhile, FIG. 7B illustrates the light emitting area according to the second modification of the present exemplary embodiment in a case where the number of light emitting units 50 is four. When focusing on only the arrangement of the light emitting units 50, the light emitting area 40 illustrated in FIG. 7B is the same as the light emitting area 40C of the comparative example in which the two light emitting units 50 have the shortest path length as illustrated in FIG. 6G. However, in the light emitting area 40 illustrated in FIG. 7B, the slit S is formed to reach the substrate 12 from the surface of the light emitting area 40 in the same manner as the light emitting area 40 illustrated in FIG. 7A. With this configuration, the path of the current is directed along the slit S, so that the path of the current I becomes a path indicated by an arrow in FIG. 7B. Therefore, the light emitting units 50-1, 50-2, 50-3 and 50-4 are aligned along the direction of the current I. The light emitting unit 50 having the shortest path length is only the light emitting unit 50-1. It should be noted that the slits S in FIGS. 7A and 7B are examples of the regulation area configured to regulate the path of the current flowing to the light emitting unit 50. The slit S may have any other shape so long as it regulates the path of the current.

With the light emitting element array according to the second modification of the present exemplary embodiment, even if the light emitting units 50 are densely disposed, the respective light emitting elements are different from each other in wiring length. In other words, even in a light emitting area in which plural light emitting units 50 have the shortest path length if no slit is provided, the number of light emitting units 50 having the shortest path length can be made just one by forming the slit according to the second modification of the present exemplary embodiment. Therefore, when ESD is applied from the p-side electrode pad 28, the degrees of damage caused in the respective light emitting units 50 are different, and a possibility that the plural light emitting units 50 do not emit light simultaneously is reduced.

[Third Modification of First Exemplary Embodiment]

Alight emitting area of a light emitting element array according to a third modification of the present exemplary embodiment will be described with reference to FIGS. 8A and 8B. In the third modification of the present exemplary embodiment, a light emitting unit 50E which is vulnerable to ESD is intentionally disposed as a light emitting unit having the shortest path length.

Figure 8A:
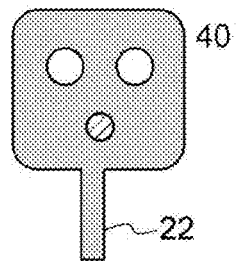
FIGS. 8A and 8B are plan views each illustrating an example of the arrangement of light emitting units in the light emitting area according to a third modification of the first exemplary embodiment.

FIG. 8A illustrates the light emitting area 40 in a case where three light emitting units 50 are disposed. When focusing on only the arrangement of light emitting units, the light emitting area 40 illustrated in FIG. 8A is the same as the light emitting area 40 illustrated in FIG. 6C. However, in the light emitting area 40 according to the third modification of the present exemplary embodiment illustrated in FIG. 8A, the light emitting unit 50E is disposed as the light emitting unit having the shortest path length. The light emitting unit 50E is a light emitting unit that is intentionally manufactured to be vulnerable to ESD. There is no particular limitation on a method of manufacturing the light emitting unit to be vulnerable to ESD. For example, a method of reducing a current confinement diameter compared to the other light emitting units 50 may be used.

The current confinement diameter is the diameter of the non-oxidized area 26a (non-oxidized area 120a) having a substantially circular shape. The smaller the current confinement diameter, the shorter the service life. This is because the resistance to the current flowing through the non-oxidized area 26a increases, and as a result, heat generation in the light emitting unit 50E increases and the junction temperature of the light emitting unit 50E increases. More specifically, the current confinement diameter normally ranges from about 3 μm to 10 μm. In this exemplary embodiment, the current confinement diameter is set to be smaller than this diameter by, for example, about 2 μm.

In the light emitting area 40 according to the third modification of the present exemplary embodiment illustrated in FIG. 8A, the light emitting unit 50E is disposed at a position where a possibility that the light emitting unit 50E is damaged first when ESD is applied is the highest. With this configuration, a deterioration due to ESD is detected at an earlier stage.

Figure 8B:
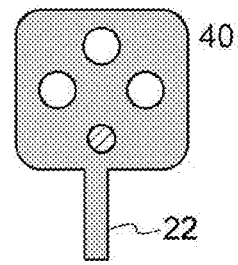

FIG. 8B illustrates the light emitting area 40 in a case where four light emitting units 50 are disposed. When focusing on only the arrangement of light emitting units, the light emitting area 40 illustrated in FIG. 8B is the same as the light emitting area 40 illustrated in FIG. 6E. However, in the light emitting area 40 according to the third modification of the present exemplary embodiment illustrated in FIG. 8B, the light emitting unit 50E is disposed as a light emitting unit having the shortest path length. Even with the light emitting area according to the third modification of the present exemplary embodiment illustrated in FIG. 8B, a deterioration due to ESD is detected at an earlier stage.

Second Exemplary Embodiment

An optical transmission device 200 according to this exemplary embodiment will be described with reference to FIGS. 9A and 9B and FIGS. 10A and 10B. An optical transmission device 200 is a device that constitutes an optical transmitter of a communication apparatus which performs mutual optical communication via an optical fiber. The optical transmission device 200 is equipped with the light emitting element array 10 according to the above-described exemplary embodiment.

Figure 9A:
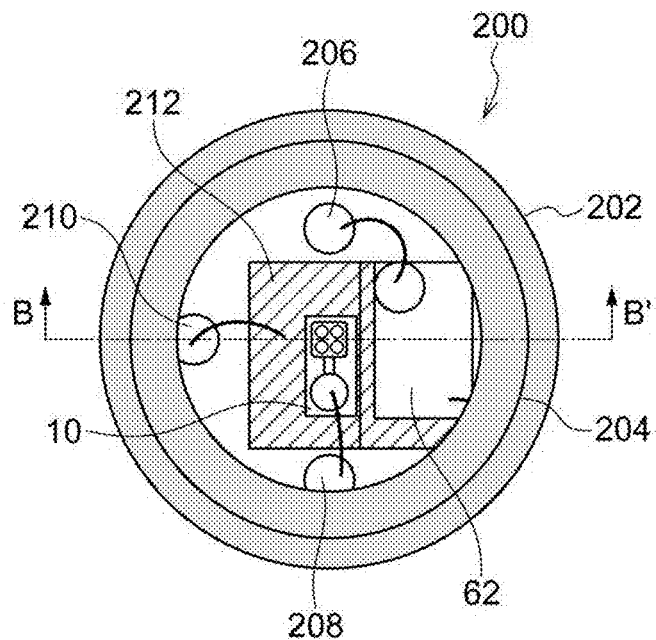
FIG. 9A is a plan view illustrating an example of the configuration of an optical transmission device according to a second exemplary embodiment.
Figure 9B:
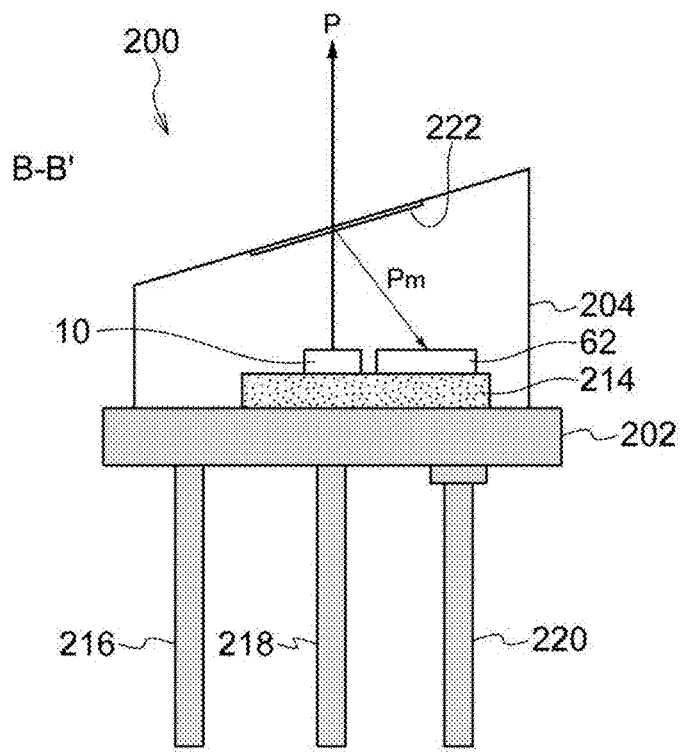
FIG. 9B is a cross-sectional view illustrating the optical transmission device.

FIG. 9A is a plan view of the optical transmission device 200. FIG. 9B is a cross-sectional view taken along line B-B' illustrated in FIG. 9A. As illustrated in FIGS. 9A and 9B, the optical transmission device 200 includes a light emitting element array 10, a monitor photo diode (PD) 62, a sub-mount 214, and a package on which these components are mounted. The package of the optical transmission device 200 includes a stem 202, a cap 204, a cathode terminal 216, anode terminals 218 and 219 (in FIG. 9B, the anode terminal 219 is invisible because it is hidden behind the anode terminal 218), and a cathode terminal 220.

The sub-mount 214 is a substrate on which the light emitting element array 10, the monitor PD 62, and the like are mounted. The sub-mount 214 is configured with, for example, a semiconductor substrate. In addition to the light emitting element array 10 and the monitor PD 62, semiconductor elements which constitute a drive unit of the light emitting element array 10 and the like and required passive components such as a resistor and a capacitor may be mounted on the sub-mount 214. In addition, an n-side wiring 212 made of a metal film or the like is formed on the surface side of the sub-mount 214 on which the light emitting element array 10 and the like are mounted. The n-side electrode wiring 30 of the light emitting element array 10 is connected to the n-side wiring 212.

The stem 202 is a metal base on which the sub-mount 214 is mounted. The stem 202 holds the cathode terminal 216, the anode terminals 218 and 219, and the cathode terminal 220. The cathode terminal 216 and the anode terminals 218 and 219 are held on the stem via a required insulator. The cathode terminal 220 is directly brazed to (has the same potential as) the stem 202.

As illustrated in FIG. 9A, the p-side electrode pad 28 of the light emitting element array 10 is connected to an anode electrode 208 by a bonding wire and is connected to the outside (for example, a drive power supply) via an anode terminal 218. Meanwhile, the n-side electrode wiring 30 of the light emitting element array 10 is connected to a cathode electrode 210 via the n-side wiring 212 and a bonding wiring, and is connected to the outside (for example, the drive power supply) via the cathode terminal 216.

The monitor PD 62 is a monitor for monitoring the amount of light of the optical output P from the light emitting unit 50 of the light emitting element array 10 when the light emitting element array 10 is driven and controlled. That is, for example, when the light emitting element array 10 is driven and controlled by automatic power control (APC), a monitor current Im corresponding to the optical output P is generated and is supplied to an APC control circuit. Of course, the driving control method of the light emitting element array 10 is not limited to the APC method. The driving control method of the light emitting element array 10 may be a constant-current driving method, a constant-voltage driving method, or the like.

The anode of the monitor PD 62 is connected to an anode electrode 206 via a bonding wire, and is connected to the outside (for example, the drive power supply) via the anode terminal 219. Meanwhile, the cathode of the monitor PD 62 is connected to the stem 202 by a bonding wire and is connected to the outside (for example, the drive power supply) via the cathode terminal 220.

The cap 204 seals a semiconductor element or the like mounted on the sub-mount 214 in an airtight manner. The cap 204 of the present exemplary embodiment is formed of a metal. A cap 204 is formed with an opening so as to allow the optical output P from the light emitting element array 10 to pass therethrough. A partial reflection mirror 222 is attached to the opening. Most of the optical output P passes through the partial reflection mirror 222 and is output to the outside (an optical fiber which will be described later in the present exemplary embodiment). However, a part of the light (about 10% as an example) is reflected by the partial reflection mirror 222 and is incident on the monitor PD 62 as monitor light Pm. The monitor light Pm generates the above-described monitor current Im.

Figure 10A:
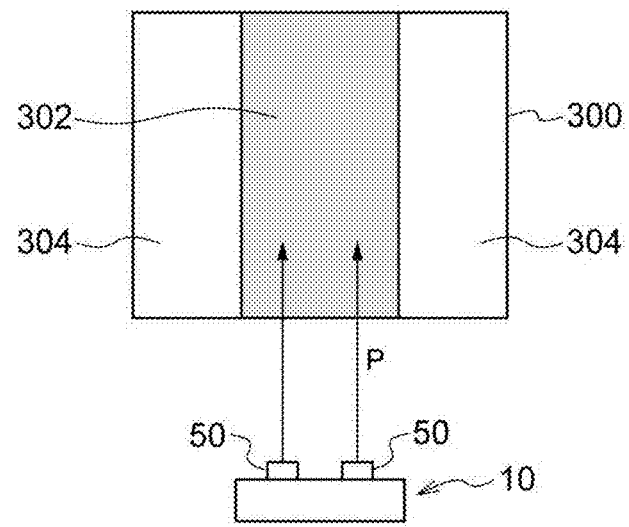
FIG. 10A is a side view illustrating a coupled state of a light emitting element array and an optical fiber in the optical transmission device according to the second exemplary embodiment.
Figure 10B:
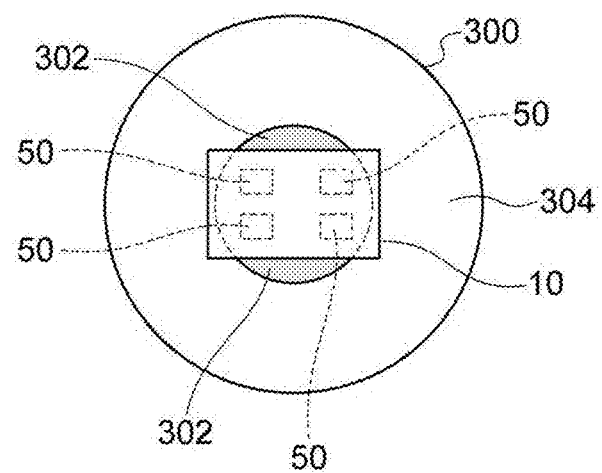
FIG. 10B is a plan view illustrating the coupled state.

Next, the coupling between the light emitting element array 10 and an optical fiber 300 will be described with reference to FIGS. 10A and 10B. FIGS. 10A and 10B are a cross-sectional view and a plan view illustrating the coupled state of the light emitting element array 10 and the optical fiber 300, respectively. As the optical fiber 300 according to the present exemplary embodiment, for example, a single mode fiber, a multi-mode fiber, or a plastic fiber may be used without particular limitation thereto. In the present exemplary embodiment, a multi-mode fiber which has a core diameter of about 100 μm or less or 100 μm or less (50 μm or 62.5 μm) is used.

As illustrated in FIG. 10A, the optical fiber 300 includes a core 302 and a clad 304. The light emitting unit 50 of the light emitting element array 10 is disposed so that the optical output P enters the core 302 of the optical fiber 300. In the present exemplary embodiment, no lens is used for the coupling between the light emitting element array 10 and the optical fiber 300. It should be noted that the disclosure is not limited thereto. The light emitting element array 10 and the optical fiber 300 may be coupled to each other using a lens.

The optical transmission device 200, which is mounted on the can-shaped package, has been described in the above-described exemplary embodiment by way of example. It should be noted that the present disclosure is not limited thereto. An optical transmission device may be mounted on a flat package.

In addition, the light emitting element array in which light emitting units are monolithically formed has been described in the respective exemplary embodiments. It should be noted that the disclosure is not limited thereto. Individual (discrete) light emitting elements as respective light emitting units may be used.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light emitting element array comprising:
a plurality of light emitting elements connected electrically in parallel to each other by a wiring connected to a terminal configured to supply a current,
wherein a number of the light emitting elements which have a shortest path length among path lengths on the wiring from the terminal to the plurality of respective light emitting elements along a path of the current is one.

2. The light emitting element array according to claim 1, wherein
the number of the plurality of light emitting elements is three, and
the number of the light emitting elements having the shortest path length is one.

3. The light emitting element array according to claim 1, wherein
the number of the plurality of light emitting elements is four, and
the number of the light emitting elements having the shortest path length is one.

4. The light emitting element array according to claim 1, wherein all of the plurality of light emitting elements have different path lengths on the wiring from the terminal to the plurality of respective light emitting elements along the path of the current.

5. The light emitting element array according to claim 2, wherein all of the plurality of light emitting elements have different path lengths on the wiring from the terminal to the plurality of respective light emitting elements along the path of the current.

6. The light emitting element array according to claim 3, wherein all of the plurality of light emitting elements have different path lengths on the wiring from the terminal to the plurality of respective light emitting elements along the path of the current.

7. An optical transmission device comprising:
the light emitting element array according to claim 1,
wherein the light emitting element array is disposed such that light emitted from the light emitting element array enters an optical transmission path configured to transmit light.

8. The optical transmission device according to claim 7, wherein the optical transmission path is a multi-mode fiber having a core diameter of about 100 μm or less.

9. The light emitting element array according to claim 1, wherein the light emitting elements, the wiring, and the terminal are formed on a common semiconductor substrate.

10. The light emitting element array according to claim 9, wherein the terminal is an electrode pad formed on the semiconductor substrate.

11. The light emitting element array according to claim 1, wherein the wiring is formed around each of the light emitting elements such that the wiring encompasses the light emitting elements.

12. The light emitting element array according to claim 1, wherein an area of the plurality of light emitting elements excluding an emission aperture is covered with the wiring.

13. The light emitting element array according to claim 2, wherein each of the light emitting elements is positioned at a vertex of a triangle.

14. The light emitting element array according to claim 3, wherein each of the light emitting elements is positioned at a vertex of a quadrangle.

15. An optical transmission device comprising:
the light emitting element array according to claim 1, and
an optical transmission path configured to transmit light,
wherein the plurality of light emitting elements are disposed such that light emitted from the plurality of light emitting elements enter a single core of the optical transmission path.

16. The optical transmission device according to claim 15, wherein the optical transmission path is an optical fiber, and
wherein a distance between the light emitting elements is less than a core diameter of the optical fiber.

17. A light emitting element array comprising:
a plurality of light emitting elements connected electrically in parallel to each other by a wiring connected to a terminal configured to supply a current,
wherein a number of the light emitting elements which have a shortest path length among path lengths on the wiring from the terminal to the plurality of respective light emitting elements along a path of the current is one, wherein the light emitting element array further comprises:

a regulation area that is formed between light emitting elements included in the plurality of light emitting elements and that is configured to regulate the path of the current flowing to the light emitting elements, wherein the number of light emitting elements which are closest to the terminal on the path of the current regulated by the regulation area is one.

18. A light emitting element array comprising:

a plurality of light emitting elements connected electrically in parallel to each other by a wiring connected to a terminal configured to supply a current, wherein a number of the light emitting elements which have a shortest path length among path lengths on the wiring from the terminal to the plurality of respective light emitting elements along a path of the current is one, and wherein a light emitting element, of the plurality of light emitting elements, having a shorter path length on the wiring from the terminal thereto along the path of the current has a smaller current confinement diameter than a light emitting element, of the plurality of light emitting elements, having a longer path length on the wiring from the terminal thereto along the path of the current has.

* * * * *